(12) United States Patent
Barber et al.

(10) Patent No.: US 7,795,781 B2
(45) Date of Patent: Sep. 14, 2010

(54) BULK ACOUSTIC WAVE RESONATOR WITH REDUCED ENERGY LOSS

(75) Inventors: Bradley P. Barber, Acton, MA (US); Frank Bi, Shrewsbury, MA (US); Craig E. Carpenter, Shirley, MA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 86 days.

(21) Appl. No.: 12/150,244

(22) Filed: Apr. 24, 2008

(65) Prior Publication Data

US 2009/0267457 A1 Oct. 29, 2009

(51) Int. Cl.
H01L 41/08 (2006.01)
(52) U.S. Cl. ..................................... 310/320
(58) Field of Classification Search ................... 310/320
See application file for complete search history.

(56) References Cited

U.S. PATENT DOCUMENTS

| | | | |
|---|---|---|---|
| 3,363,119 A | 1/1968 | Koneval et al. | |
| 3,365,591 A | 1/1968 | Curran et al. | |
| 3,401,276 A | 9/1968 | Curran et al. | |
| 4,634,914 A * | 1/1987 | Ballato | 310/313 D |
| 6,091,406 A * | 7/2000 | Kambara et al. | 345/177 |
| 6,420,202 B1 * | 7/2002 | Barber et al. | 438/52 |
| 6,424,237 B1 * | 7/2002 | Ruby et al. | 333/187 |
| 6,657,363 B1 | 12/2003 | Aigner | |
| 6,812,619 B1 * | 11/2004 | Kaitila et al. | 310/320 |
| 6,933,809 B2 | 8/2005 | Kyoung et al. | |
| 7,148,769 B2 * | 12/2006 | Takano | 333/193 |
| 7,323,953 B2 | 1/2008 | Yokoyama et al. | |
| 7,369,013 B2 * | 5/2008 | Fazzio et al. | 333/187 |
| 7,482,737 B2 | 1/2009 | Yamada et al. | |
| 7,535,154 B2 * | 5/2009 | Umeda et al. | 310/320 |
| 7,594,307 B2 | 9/2009 | Morimura | |
| 2002/0121840 A1 | 9/2002 | Larson et al. | |
| 2005/0140247 A1 | 6/2005 | Lee | |
| 2006/0103492 A1 | 5/2006 | Feng et al. | |
| 2006/0132262 A1 * | 6/2006 | Fazzio et al. | 333/187 |
| 2006/0226932 A1 | 10/2006 | Fazzio et al. | |
| 2008/0157629 A1 | 7/2008 | Noguchi et al. | |
| 2009/0045703 A1 | 2/2009 | Barber et al. | |
| 2009/0045704 A1 | 2/2009 | Barber et al. | |

FOREIGN PATENT DOCUMENTS

| | | |
|---|---|---|
| JP | 2007/006542 | 1/2007 |
| WO | 2005008889 | 1/2005 |

OTHER PUBLICATIONS

International Searching Authority, "Notification of Transmittal of the International Search Report and the Written Opinion of the International Searching Authority, or the Declaration", *International Application No. PCT/US2009/041265* Nov. 30, 2009.

* cited by examiner

*Primary Examiner*—J. SanMartin

(57) ABSTRACT

According to an exemplary embodiment, a bulk acoustic wave (BAW) resonator includes a piezoelectric layer having a disrupted texture region, where the disrupted texture region is situated in a controlled thickness region of the BAW resonator. The BAW resonator further includes lower and upper electrodes situated on opposite surfaces of the piezoelectric layer. The controlled thickness region has controlled electromechanical coupling and includes a segment of material situated over the upper electrode. The segment of material can be a metal or a dielectric material. The disrupted texture region can be situated at an edge of the BAW resonator and can extend along a perimeter of the BAW resonator.

13 Claims, 4 Drawing Sheets

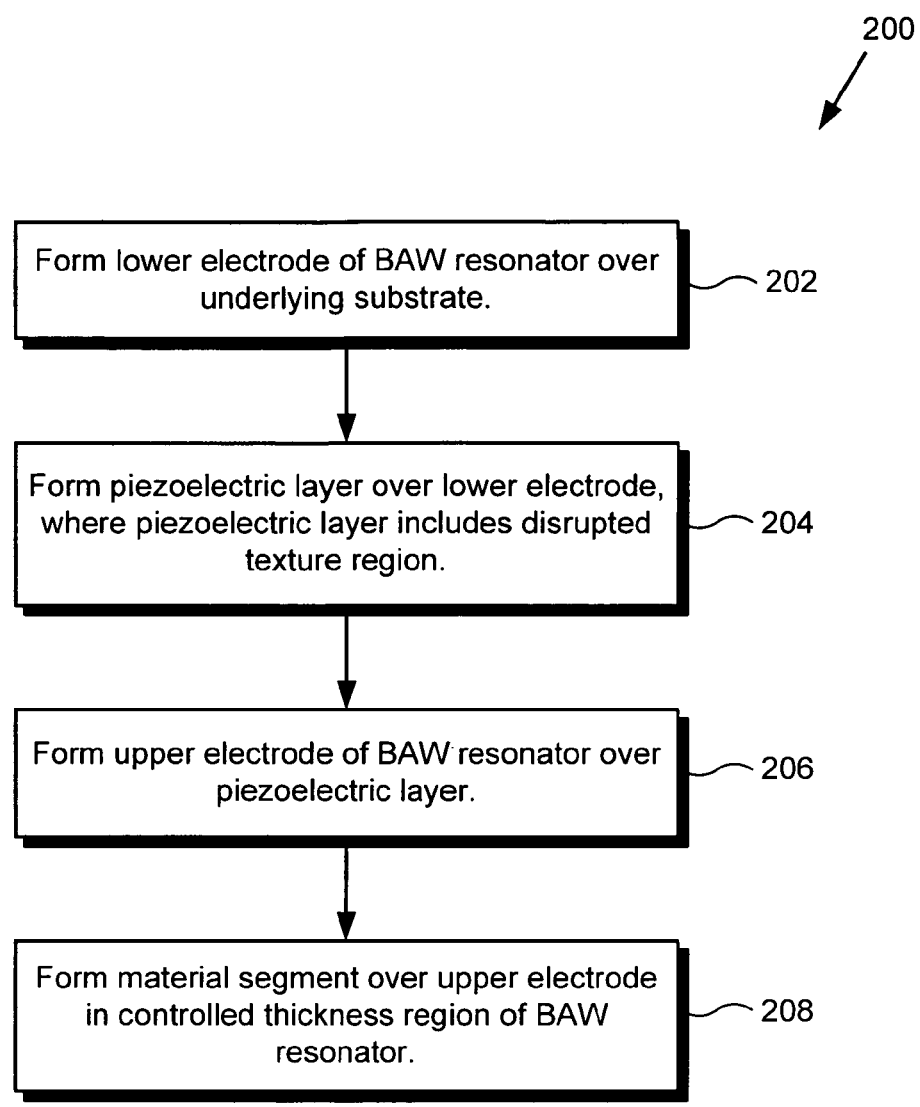

BULK ACOUSTIC WAVE RESONATOR WITH REDUCED ENERGY LOSS

BACKGROUND OF THE INVENTION

1. Field of the Invention

The present invention generally relates to the field of electronics. More particularly, the invention relates to bulk acoustic wave (BAW) resonators.

2. Background Art

Because of their small footprint, low profile, and high performance, bulk acoustic wave (BAW) filters are increasingly utilized to provide radio frequency (RF) filtering in mobile electronic devices, such as cellular phones, as well as other types of electronic devices. BAW filters can include a number of BAW resonators, where each BAW resonator typically includes a layer of piezoelectric material, such as aluminum nitride, sandwiched between upper and lower electrodes. When an electric field is applied across the upper and lower electrodes of the BAW resonator, the electric field can cause the layer of piezoelectric material to vibrate. As a result, the piezoelectric material can generate a number of allowed modes of acoustic wave propagation, which include a desired longitudinal mode. However, unwanted excitation of energy in modes of wave propagation that have high energy loss, such as lateral modes, can cause a significant loss of energy in a BAW resonator and, thereby, undesirably lower the BAW resonator's quality factor (Q).

Conventional approaches to reducing energy loss in a BAW resonator include shaping the profile of the resonator such that the energy is best contained and controlled in a desired longitudinal mode. In one conventional profile shaping approach, a shaped region can be provided close to the edge of the BAW resonator, which is a region of high energy loss, to reduce the amount of energy that is excited in lossy modes of wave propagation in the BAW resonator. However, the shaped region provided in this conventional approach can also introduce additional unwanted modes, such as lateral modes contained within the shaped region, which can cause energy loss in the BAW resonator.

SUMMARY OF THE INVENTION

A bulk acoustic wave resonator with reduced energy loss, substantially as shown in and/or described in connection with at least one of the figures, as set forth more completely in the claims.

BRIEF DESCRIPTION OF THE DRAWINGS

FIG. 2 shows a flowchart illustrating an exemplary method for fabricating a BAW resonator in accordance with one embodiment of the present invention.

DETAILED DESCRIPTION OF THE INVENTION

The present invention is directed to a bulk acoustic wave resonator with reduced energy loss. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1A:
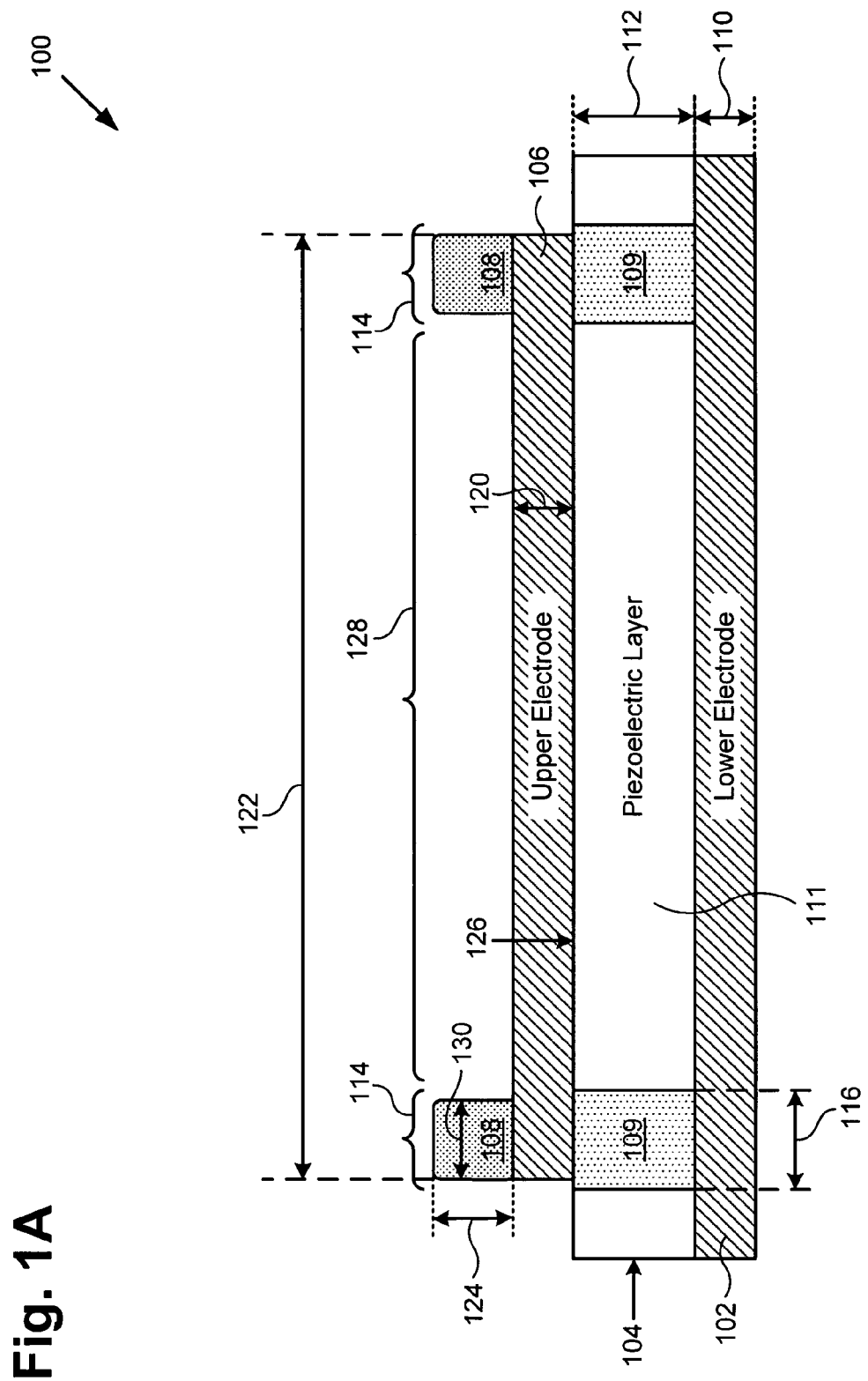
FIG. 1A illustrates a cross-sectional view of an exemplary bulk acoustic wave (BAW) resonator, in accordance with one embodiment of the present invention.

FIG. 1A shows a cross-sectional view of BAW resonator 100, in accordance with one embodiment of the present invention. Certain details and features have been left out of FIG. 1A, which are apparent to a person of ordinary skill in the art. BAW resonator 100 includes lower electrode 102, piezoelectric layer 104, upper electrode 106, and material segment 108. BAW resonator 100 can further include an acoustic mirror, which provides acoustic isolation from an underlying substrate. The acoustic mirror and the substrate over which BAW resonator 100 is fabricated are not shown in FIG. 1A so as not to obscure the invention. In one embodiment, BAW resonator 100 can be a film bulk acoustic wave resonator (FBAR) and can be acoustically isolated from an underlying substrate by an air cavity. BAW resonator 100 can be utilized in a BAW filter to provide RF filtering in a cell phone or other type of semiconductor device and can be fabricated in a semiconductor die.

As shown in FIG. 1A, lower electrode 102 can be situated over, for example, an acoustic mirror, which is not shown in FIG. 1A, and can comprise tungsten, molybdenum, or other suitable metal having a high density (i.e. a high density metal). Lower electrode 102 has thickness 110, which can be, for example, between 500.0 Angstroms and 5000.0 Angstroms. Lower electrode 102 can be formed by depositing a layer of high density metal, such as tungsten or molybdenum, over a layer of material (not shown in FIG. 1A) by utilizing a physical vapor deposition (PVD) or sputtering process or other suitable deposition process and appropriately patterning the layer of high density metal.

Also shown in FIG. 1A, piezoelectric layer 104 is situated over lower electrode 102, includes disrupted texture region 109 and non-disrupted texture region 111, and has top surface 126. A seed layer (not shown in FIG. 1A) can be situated between piezoelectric layer 104 and lower electrode 102. Piezoelectric layer 104 can comprise aluminum nitride (AlN) or other suitable piezoelectric material and has thickness 112, which can be, for example, between 0.5 microns and 3.0 microns. Disrupted texture region 109 is situated in controlled thickness region 114 at the edge of BAW resonator 100 and extends along the entire perimeter of the BAW resonator. Disrupted texture region 109 has width 116, which can be, for example, between 1.0 micron and 5.0 microns. In disrupted texture region 109, the crystallinity of the piezoelectric material is disrupted so as to cause significantly reduced electromechanical coupling therein. Non-disrupted texture region 111 is situated adjacent to and surrounded by disrupted texture region 109 and comprises piezoelectric material having normal crystallinity, i.e., crystallinity that has not been intentionally disrupted. Piezoelectric layer 104 can be formed by, for example, depositing a layer of aluminum nitride over lower electrode 102 by utilizing a PVD or sputtering process, a CVD process, or other suitable deposition process.

Prior to formation of piezoelectric layer 104, the surface area that will underlie disrupted texture region 109 can be sufficiently disturbed so as to insure that the texture of the piezoelectric material will be disrupted when piezoelectric layer 104 is formed. For example, a thin layer of material known to disrupt texture, such as silicon oxide, can be deposited over a thin seed layer (not shown in FIG. 1A) in the surface region of lower electrode 102 over which disrupted texture region 109 will be formed. As another example, an etch process or other suitable process can be utilized to roughen the surface region of lower electrode 102 over which disrupted texture region 109 will be formed. In one embodiment, the surface region of a layer (not shown in FIG. 1A) underlying the region of lower electrode over which disrupted texture region 108 will be formed can be roughened prior to forming the lower electrode. The resulting disruption in the texture of the lower electrode caused by the roughening of the surface region of the underlying layer can, in turn, cause the texture of the piezoelectric material to be disrupted in disrupted texture region 108 when piezoelectric layer 104 is formed.

Further shown in FIG. 1A, upper electrode 106 is situated over piezoelectric layer 104 and can comprise tungsten, molybdenum, or other suitable dense metal. Upper electrode 106 has thickness 120, which can be, for example, between 500.0 Angstroms and 5000.0 Angstroms. Upper electrode 106 has width 122, which can be less than the width of lower electrode 102 and which defines the width of the active portion of BAW resonator 100. In one embodiment, upper electrode 106 and lower electrode 102 can be approximately equal in width. Upper electrode 106 can be formed by depositing a layer of dense metal, such as tungsten or molybdenum, over piezoelectric layer 104 by utilizing a PVD or sputtering process or other suitable deposition process. The layer of dense metal can be appropriately patterned by utilizing a suitable etch process. In the present embodiment, the edge of upper electrode 106 can be self-aligned with the outer edge of material segment 108 as discussed below.

Also shown in FIG. 1A, material segment 108 is situated over upper electrode 106 at the edge of BAW resonator 100. Material segment 108 is also situated in controlled thickness region 114 and extends along the entire perimeter of BAW resonator 100. Material segment 108 can comprise a metal, such as a low or high density metal, a dielectric material, or a semiconductor material and has thickness 124 and width 130. For example, thickness 124 of material segment 108 can be between 100.0 Angstroms and 3000.0 Angstroms. Width 130 of material segment 108 can be, for example, between 1.0 micron and 5.0 microns. In the embodiment in FIG. 1A, material segment 108 has a uniform cross-sectional thickness. In other embodiments, material segment 108 can have a non-uniform cross-sectional thickness and can have a wedge shape, a teardrop shape, or other suitable shape.

Material segment 108 can be formed by depositing a layer of material over upper electrode 106 by utilizing a PVD or sputtering process, a CVD process, or other suitable deposition process. The layer of material can then be appropriately patterned by utilizing a suitable etch process to form the inner edge of material segment 108. In the embodiment in FIG. 1A, the outer edge of material segment 108 can be formed concurrently with the edge of upper electrode 106 in the same etch process so as to precisely define the edge of BAW resonator 100. In one embodiment, the layer of material can be appropriately patterned by utilizing a suitable etch process to form the inner and outer edges of material segment 108. In that embodiment, material segment 108 can overlap the edge of upper electrode 106 or fall entirely within its boundary.

Further shown in FIG. 1A, controlled thickness region 114 is situated at the edge of BAW resonator 100 and includes material segment 108, disrupted texture region 109 of piezoelectric layer 104, and the portion of upper electrode 106 situated between material segment 108 and disrupted texture region 109. In another embodiment, controlled thickness region 114 can be formed at a location other than at the edge of the BAW resonator. Also shown in FIG. 1A, high density metal region 128 is situated adjacent to and surrounded by controlled thickness region 114 and includes the region of BAW resonator 100 in which upper electrode 106 is situated over non-disrupted texture region 111 of piezoelectric layer 104.

Figure 1B:
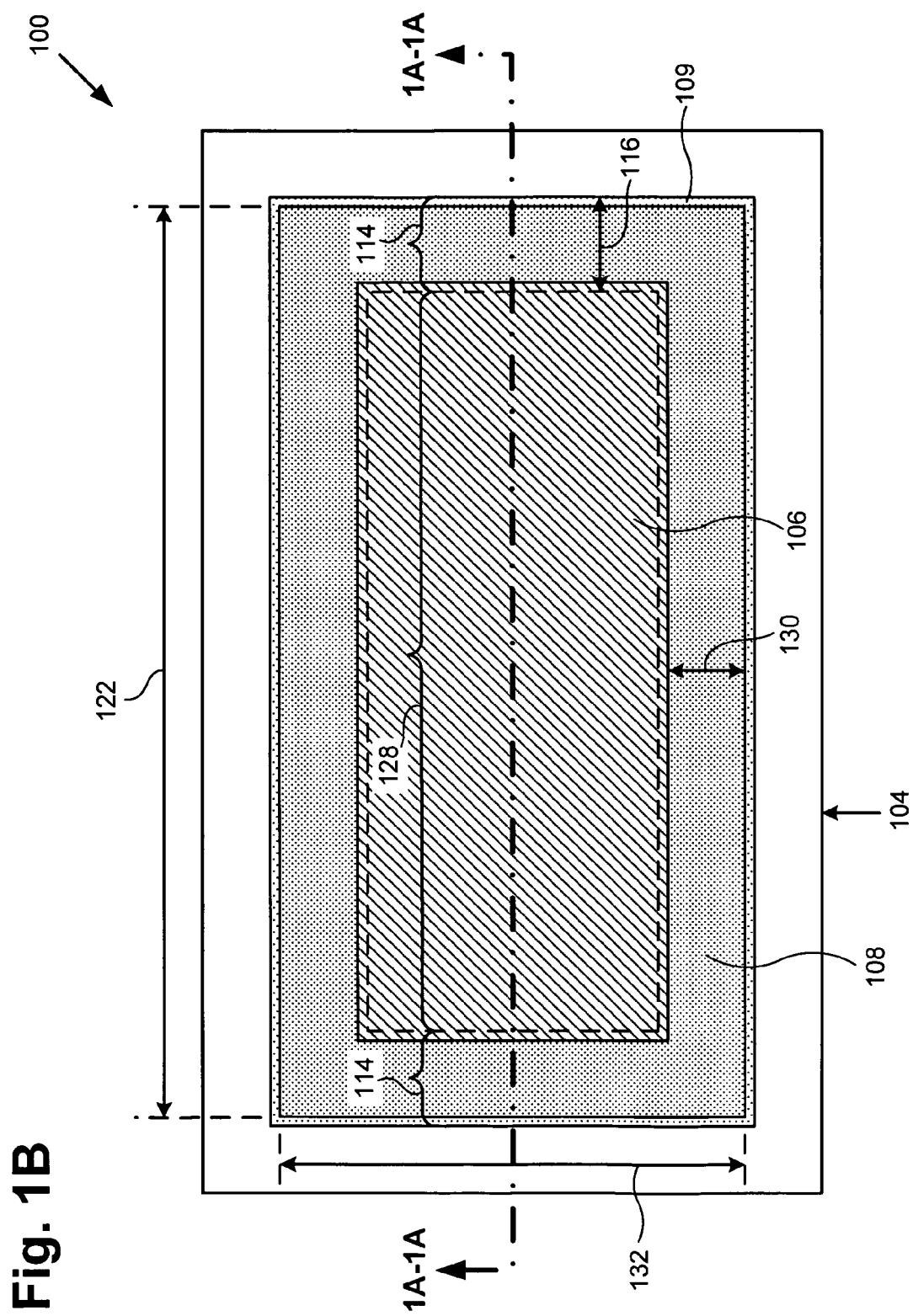
FIG. 1B illustrates a top view of the exemplary BAW resonator of FIG. 1A.

FIG. 1B shows a top view of structure 100, where the cross-sectional view of BAW resonator 100 in FIG. 1A is across line 1A-1A in FIG. 1B. In particular, piezoelectric layer 104, upper electrode 106, material segment 108, disrupted texture region 109, controlled thickness region 114, widths 116, 122, and 130, and high density metal region 128 correspond to the same elements in FIG. 1A and FIG. 1B. As shown in FIG. 1B, upper electrode 106 has depth 132, which defines the approximate depth of the active region of BAW resonator 100. In the embodiment in FIGS. 1A and 1B, BAW resonator 100 has a rectangular shape. In one embodiment, BAW resonator 100 can have a square shape, wherein width 122 can be approximately equal to depth 132. There can also be advantages to rounding the BAW resonator's corners and/or forming the resonator such that opposite sides of the resonator are not parallel.

As shown in FIG. 1B, controlled thickness region 114 is situated at the edge of BAW resonator 100, extends along the resonator's perimeter, and has a width that is defined by width 116 of disrupted texture region 109. Also shown in FIG. 1B, material segment 108 is situated over upper electrode 106 and disrupted texture region 109 and is also situated at the edge of BAW resonator 100. Material segment 108 is further situated in controlled thickness region 114 and extends along the perimeter of BAW resonator 100.

The operation of BAW resonator 100 will now be discussed. When an electric field is applied across piezoelectric layer 104 via upper electrode 106 and lower electrode 102, electrical energy is converted into acoustic energy in piezoelectric layer 104 through electromechanical coupling, thereby causing piezoelectric layer 104 to vibrate. As a result, piezoelectric layer 104 can generate acoustic waves that can propagate in a longitudinal mode, i.e., in a direction perpendicular to top surface 126 of piezoelectric layer 104, which is a desired mode. However, as a result of the crystalline structure of piezoelectric layer 104, the edge region of BAW resonator 100, and other factors, a multitude of other, unwanted modes of wave propagation can also be generated in piezoelectric layer 104. For example, unwanted modes such as lateral modes, i.e., modes of acoustic wave propagation that occur in a direction parallel to top surface 126 of piezoelectric layer 104, can be generated in piezoelectric layer 104. As discussed above, a significant loss of energy in BAW resonators can occur as a result of coupling energy into unwanted modes, such as lateral modes. In particular, the edge of a BAW resonator, such as BAW resonator 100, is a lossy region of the resonator wherein coupling into unwanted, lossy modes, such as lateral modes, can undesirably increase energy loss in the BAW resonator.

In BAW resonator 100, controlled thickness region 114 includes material segment 108, which is situated over upper electrode 106 to provide thickness shaping at the edge of the resonator, and disrupted texture region 109, which comprises piezoelectric material having disrupted crystallinity. As a result, the electromechanical coupling can be controlled and, thereby, significantly reduced in controlled thickness region 114. Thus, electromechanical coupling into unwanted modes, such as lateral modes, as well as coupling into the desired longitudinal mode, can be significantly reduced in controlled thickness region 114. However, the overall loss of coupling into the longitudinal mode in BAW resonator 100 as a result of the loss of coupling in controlled thickness region 114 is significantly less than the overall reduction in energy loss achieved in BAW resonator 100 by reducing electromechanical coupling into unwanted modes in controlled thickness region 114. Also, width 130, thickness 124, the composition of material segment 108, and width 116 of disrupted texture region 109 of piezoelectric layer 104 can be appropriately selected to optimize reduction of coupling into unwanted modes, such as lateral modes.

Thus, by utilizing disrupted texture region 109 of piezoelectric layer 104 to reduce electromechanical coupling in controlled thickness region 114, an embodiment of the invention's BAW resonator 100 achieves a significant reduction of electromechanical coupling into unwanted modes, thereby significantly reducing overall energy loss in BAW resonator 100. By reducing overall energy loss, the invention advantageously achieves a BAW resonator having an increased Q.

From the above description of the embodiment of invention in FIGS. 1A and 1B, it is manifest to one of ordinary skill in the art that a material segment, such as material segment 108, can alternatively be formed under disrupted texture region 109 of piezoelectric layer 104 and even under lower electrode 102 in BAW resonator 100 to achieve similar advantages as discussed above.

FIG. 2 shows a flowchart illustrating an exemplary method according to one embodiment of the present invention. Certain details and features have been left out of flowchart 200 that are apparent to a person of ordinary skill in the art. For example, a step may consist of one or more substeps or may involve specialized equipment or materials, as known in the art. It is noted that the processing steps shown in flowchart 200 are performed on a portion of a processed wafer, which, prior to step 202 of flowchart 200, includes, among other things, an acoustic mirror or an air cavity overlying a substrate, which are not shown in any of the figures.

At step 202 of flowchart 200, lower electrode 102 of BAW resonator 100 in FIG. 1A is formed over a substrate (not shown in any of the figures). In one embodiment, lower electrode 102 can be formed over an acoustic mirror (not shown in any of the figures), which can be formed over the substrate. In another embodiment, lower electrode 102 can be formed over an air cavity (not shown in any of the figures), which can be formed over the substrate. Lower electrode 102 can comprise a high density metal, such as tungsten or molybdenum, and can be formed by depositing a layer of high density metal by utilizing a PVD or sputtering process or other suitable deposition process and appropriately patterning the layer of high density metal. At step 204, piezoelectric layer 104 is formed over lower electrode 202, where piezoelectric layer 104 includes disrupted texture region 109. In disrupted texture region 109, the crystallinity of the piezoelectric material is disrupted to significantly reduce electromechanical coupling in controlled thickness region 114.

Prior to formation of piezoelectric layer 104, the surface area that will underlie disrupted texture region 109 can be sufficiently disturbed so as to insure that the texture of the piezoelectric material will be disrupted when piezoelectric layer 104 is formed. For example, an etch process or other suitable process can be utilized to roughen the surface region of lower electrode 102 over which disrupted texture region 109 will be formed. This disruption can alternatively be done before the lower electrode is deposited since in some cases disruption of the lower electrode's texture will subsequently disrupt the piezoelectric material's texture. In one implementation, piezoelectric layer 104 can comprise aluminum nitride and can be formed by depositing a layer of aluminum nitride over lower electrode 102 by utilizing a PVD process or other suitable deposition process and appropriately patterning the layer of aluminum nitride. At step 206, upper electrode 106 of BAW resonator 100 is formed over piezoelectric layer 104. For example, upper electrode 106 can comprise a high density metal, such as tungsten or molybdenum, and can be formed by depositing a layer of high density metal over piezoelectric layer 104 by utilizing a PVD or sputtering process and appropriately patterning the layer of high density metal.

At step 208, material segment 108 is formed over upper electrode 106 in controlled thickness region 114 of BAW resonator 100. For example, material segment 108 can comprise a metal, a dielectric material, or a semiconductor material and can be formed by depositing a layer of the material over upper electrode 106 in controlled thickness region 114 by utilizing a CVD or other suitable deposition process. After deposition, the layer of material can be appropriately patterned by utilizing a suitable etch process. For example, the layer of material can be concurrently etched with an underlying layer of unpatterned high density metal such that the outer edge of material segment 108 is self-aligned with the edge of upper electrode 106.

Figure 3:
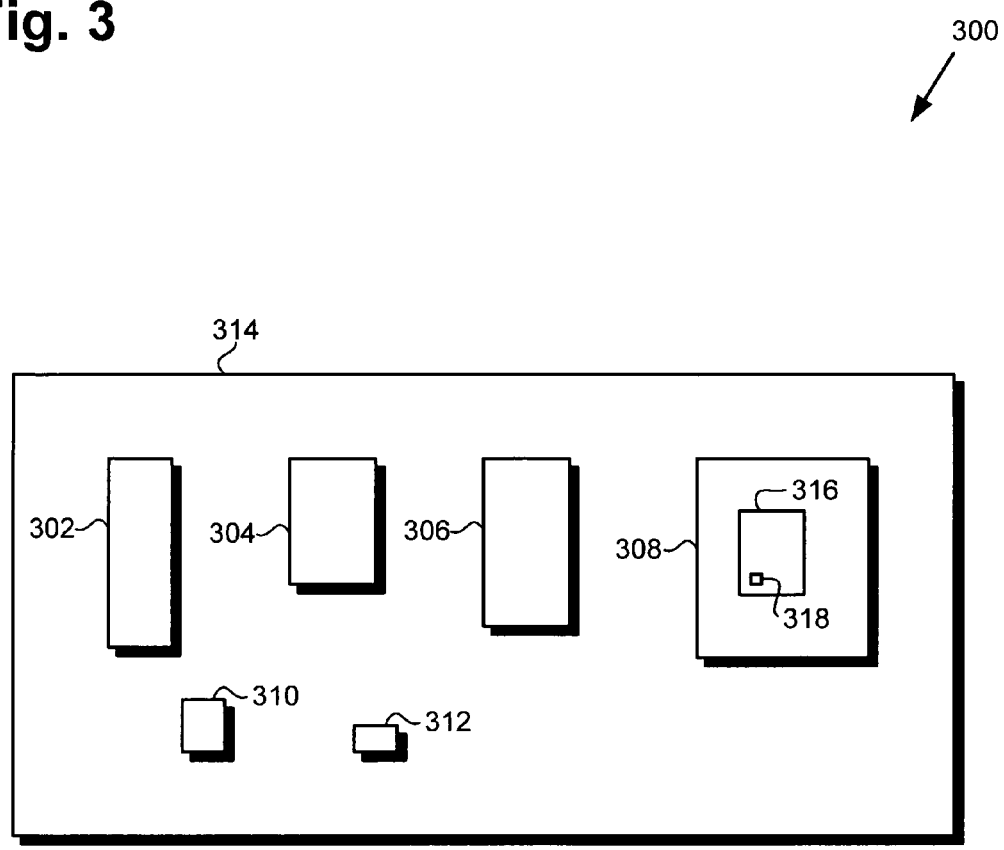
FIG. 3 is a diagram of an exemplary electronic system including an exemplary chip or die utilizing a BAW resonator in accordance with one embodiment of the present invention.

FIG. 3 illustrates a diagram of an exemplary electronic system including an exemplary chip or die utilizing one or more BAW resonators in accordance with one embodiment of the present invention. Electronic system 300 includes exemplary modules 302, 304, and 306, IC chip or semiconductor die 308, discrete components 310 and 312, residing in and interconnected through circuit board 314. In one embodiment, electronic system 300 may include more than one PCB. IC chip 308 includes circuit 316, which can comprise a BAW filter, including one or more of the invention's BAW resonators designated by numeral 318.

As shown in FIG. 3, modules 302, 304, and 306 are mounted on circuit board 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 314 can include a number of interconnect traces (not shown in FIG. 3) for interconnecting modules 302, 304, and 306, discrete components 310 and 312, and IC chip 308.

Also shown in FIG. 3, IC chip 308 is mounted on circuit board 314 and can be, for example, any chip utilizing one or more of an embodiment of the invention's BAW resonator, such as BAW resonator 100 in FIGS. 1A and 1B. In one embodiment, IC chip 308 may not be mounted on circuit board 314, and may be interconnected with other modules on different circuit boards. As stated above, circuit 316 is situated in IC chip 308 and can comprise a BAW filter including one or more of the invention's BAW resonators designated by numeral 318. Further shown in FIG. 3, discrete components 310 and 312 are mounted on circuit board 314 and can each be, for example, a discrete filter, such as one including a SAW filter or the like, a power amplifier or an operational amplifier, a semiconductor device, such as a transistor or a diode or the like, an antenna element, an inductor, a capacitor, or a resistor.

Electronic system 300 can be utilized in, for example, a wired or wireless communications device, a cell phone, a switching device, a router, a repeater, a codec, a wired or wireless LAN, a WLAN, a Bluetooth enabled device, a Global Positioning System (GPS) device, a computer, a monitor, a television set, a satellite set top box, a cable modem, a printer, a copier, an RF transceiver, a personal digital assistant (PDA), or in any other kind of system, device, component or module utilized in modern electronics applications.

Thus, as discussed above, in the embodiment in FIGS. 1A and 1B, the invention provides a BAW resonator having a controlled thickness region that includes a material segment to provide thickness shaping and a disrupted texture region of a piezoelectric layer to provide controlled electromechanical coupling. By utilizing a controlled thickness region to reduce electromechanical coupling at the edge of the BAW resonator, the invention's BAW resonator advantageously achieves a significant reduction in energy loss by significantly decreasing electromechanical coupling into unwanted, lossy modes compared to a conventional BAW resonator utilizing only profile shaping to reduce energy loss. As a result, the invention's BAW resonator advantageously achieves a higher Q compared to the conventional BAW resonator.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a bulk acoustic wave resonator with reduced energy loss has been described.

The invention claimed is:

1. A bulk acoustic wave (BAW) resonator comprising:
   a piezoelectric layer having a disrupted texture region, said disrupted texture region being situated in a controlled thickness region of said BAW resonator and having a disrupted crystallinity; and
   lower and upper electrodes situated on opposite surfaces of said piezoelectric layer; wherein said controlled thickness region has a controlled electromechanical coupling.

2. The BAW resonator of claim 1, wherein said controlled thickness region provides reduced electromechanical coupling into lateral modes.

3. The BAW resonator of claim 1, wherein said controlled thickness region is situated at an edge of said BAW resonator and extends along a perimeter of said BAW resonator.

4. The BAW resonator of claim 1, wherein said controlled thickness region includes a segment of material situated over said upper electrode.

5. The BAW resonator of claim 4, wherein said segment of material is selected from the group consisting of a metal and a dielectric material.

6. The BAW resonator of claim 4, wherein an outer edge of said segment of material is self-aligned with an edge of said upper electrode.

7. The BAW resonator of claim 1 further comprising a thin layer of silicon oxide underlying said disrupted texture region and situated between said lower electrode and said piezoelectric layer.

8. The BAW resonator of claim 1, wherein said disrupted texture region is situated at an edge of said BAW resonator and extends along a perimeter of said BAW resonator.

9. A semiconductor die comprising at least one BAW resonator, said at least one BAW resonator comprising:
   a piezoelectric layer having a disrupted texture region, said disrupted texture region situated in a controlled thickness region of said BAW resonator and having a disrupted crystallinity;
   lower and upper electrodes situated on opposite surfaces of said piezoelectric layer; wherein said controlled thickness region has a controlled electromechanical coupling.

10. The semiconductor die of claim 9, wherein said controlled thickness region provides reduced electromechanical coupling into lateral modes.

11. The semiconductor die of claim 9, wherein said controlled thickness region is situated at an edge of said BAW resonator and extends along a perimeter of said BAW resonator.

12. The semiconductor die of claim 9, wherein said controlled thickness region includes a segment of material situated over said upper electrode.

13. The semiconductor die of claim 9, wherein said semiconductor die is utilized in a circuit board as a part of an electronic system, said electronic system being selected from the group consisting of a wired or wireless communications device, a cell phone, a switching device, a router, a repeater, a codec, a wired or wireless LAN, a WLAN, a Bluetooth enabled device, a Global Positioning System (GPS) device, a computer, a monitor, a television set, a satellite set top box, a cable modem, a printer, a copier, an RF transceiver, and a personal digital assistant (PDA).

* * * * *